United States Patent
Jaksic et al.

(10) Patent No.: US 10,256,806 B2
(45) Date of Patent: Apr. 9, 2019

(54) POWER SWITCH PROTECTION SYSTEM AND METHOD

(71) Applicant: GM GLOBAL TECHNOLOGY OPERATIONS LLC, Detroit, MI (US)

(72) Inventors: Marko Jaksic, Rochester Hills, MI (US); Subramanian Vadula, Novi, MI (US); Zilai Zhao, Novi, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

(21) Appl. No.: 15/597,013

(22) Filed: May 16, 2017

(65) Prior Publication Data

US 2018/0337667 A1 Nov. 22, 2018

(51) Int. Cl.
- *H02P 27/06* (2006.01)
- *H03K 17/082* (2006.01)
- *B60L 11/18* (2006.01)

(52) U.S. Cl.
CPC ...... *H03K 17/0828* (2013.01); *B60L 11/1803* (2013.01); *H02P 27/06* (2013.01)

(58) Field of Classification Search
CPC . Y02T 10/7005; Y02T 10/7077; Y02T 10/70; B60W 10/08; H02P 27/06; H02P 27/08; H02P 27/02; H02M 5/4505
USPC ................. 318/139, 798, 800, 801
See application file for complete search history.

(56) References Cited

U.S. PATENT DOCUMENTS

| | | | | |
|---|---|---|---|---|
| 4,491,768 A | * | 1/1985 | Slicker | B60L 11/1803 318/139 |
| 5,500,616 A | * | 3/1996 | Ochi | H03K 17/0822 327/310 |
| 7,012,392 B2 | * | 3/2006 | Nguyen | H02P 3/12 318/371 |
| 7,741,796 B2 | * | 6/2010 | Poyhonen | H02P 29/0241 318/368 |
| 7,983,013 B2 | * | 7/2011 | Huang | H03K 17/0828 361/93.1 |
| 2013/0242438 A1 | * | 9/2013 | Fukuta | H02H 1/0007 361/18 |
| 2014/0203843 A1 | * | 7/2014 | Cottell | H03K 17/78 327/81 |

* cited by examiner

*Primary Examiner* — Rina I Duda
(74) *Attorney, Agent, or Firm* — Lorenz & Kopf, LLP (57) ABSTRACT

An electric vehicle includes a direct current (DC) power source with a DC electric power output. An inverter is coupled to receive the DC electric power output of the DC power source, and the inverter has an alternating current (AC) electric power output. An electric motor is coupled to receive the AC electric power output. The electric motor has a driving torque output that is coupled to drive at least one wheel of the vehicle. The inverter further includes a power semiconductor switch, such as an insulated-gate bipolar transistor (IGBT). A protection circuit is coupled to the power semiconductor switch, and the protection circuit has an adjustable protection detection level circuit.

8 Claims, 8 Drawing Sheets

POWER SWITCH PROTECTION SYSTEM AND METHOD

TECHNICAL FIELD

This patent relates to protection of power semiconductor switches, and in particular, to desaturation protection for power semiconductor switches in an inverter such as the type that may be used to provide electric power from a battery to an electric motor of an electric vehicle.

BACKGROUND

Electronic power converters are used extensively for modifying readily available sources of electric power to suit specific applications. These converters are used heavily in the manufacturing industry, in conventional and renewable power generation and transmission, and in automotive applications. Such converters may provide a direct current (DC) to DC function, a DC to alternating current (AC) function or an AC to AC function. These converters use solid-state devices, such as power semiconductor switches, typically insulated gate bipolar junction transistors (IGBTs) and metal oxide semiconductor field effect transistors (MOSFETs), to achieve the required switching process. While the switches enable the transfer of great amounts of power, their control, essentially the turn on and turn off functions, is accomplished using very little energy through a gate terminal.

Desaturation protection circuits monitors switch voltage while the switch conducts current. In the case current becomes excessive, the protection circuit would detect enlarged switch voltage and trigger the safe turn off. The turn off process results in large voltage overshoot across the main terminals. This excess voltage could destroy the device under unfavorable conditions, specifically an excessive current situation. One common way of detecting such an impending destruction is to observe the desaturation of the IGBT when the voltage across the collector-emitter terminals rises well above the desired, saturated condition. The IGBT is turned off immediately upon detection of desaturation through a slower than normal process to limit the voltage overshoot. The desaturation detection circuit includes a 'blanking' time to prevent premature reaction and possibly a level adjusting feature.

Electric motor drive systems as generally employed in electric vehicle applications typically include an AC electric motor, a power inverter and a DC power source, such as a storage battery. The power inverter typically converts the DC electric power from the power source to AC electric power to drive the electric motor. The inverter may include IGBT or similar power semiconductor based switches that switch in a complementary manner to convert the DC power to AC power. This AC power drives the AC electric motor, which in turn drives one or more wheels of the vehicle thereby providing propulsion.

When the IGBT of an IGBT-based inverter is fully on, it provides a low resistance, although not resistance free, conduction path from the collector to the emitter of the IGBT. The fully on voltage from collector to emitter is referred to as the saturation voltage, $V_{cesat}$. If the current flow through the IGBT increases above a permissible threshold, the collector-emitter voltage rises above $V_{cesat}$, and indicates the IGBT is no longer operating in the saturation region, i.e., it has become desaturated. Continued operation in desaturation can lead to failure of the IGBT, and hence the circuit designer is challenged to design a gate driver circuit that will turn the IGBT off when desaturation is detected.

Advantageously, desaturation can be detected by detecting the rises of the collector-emitter voltage above $V_{cesat}$. Commercially available IGBT gate driver integrated circuits (ICs) are designed to detect a desaturation voltage, $V_{cedesat}$, above a fixed threshold before taking action to turn the IGBT off. Providing a fixed threshold within the IGBT gate driver circuit limits the ability of the inverter designer to adjust the desaturation threshold to a given application to take full advantage of the IGBT capabilities.

SUMMARY

An electric vehicle includes a direct current (DC) power source with a DC electric power output. An inverter is coupled to receive the DC electric power output of the DC power source, and the inverter has an alternating current (AC) electric power output. An electric motor is coupled to receive the AC electric power output. The electric motor has a driving torque output that is coupled to drive at least one wheel of the vehicle. The inverter further includes a power semiconductor switch. The power semiconductor switch is driven by a drive circuit having a driving output coupled to the power semiconductor switch. A protection circuit is coupled to the power semiconductor switch, and the protection circuit has an adjustable protection detection level circuit.

An inverter includes power semiconductor switch that is coupled to a drive circuit. The inverter includes an adjustable protection detection circuit disposed between the power semiconductor switch and the drive circuit.

DETAILED DESCRIPTION

A vehicle uses alternating current (AC) electric power provided from a direct current (DC) electric current power source, such as a storage battery, via an inverter to drive at least one vehicle wheel. A controller is coupled to the inverter to control operation of at least one power semiconductor switch, such as an insulated-gate bipolar transistor (IGBT), a junction field effect transistor (JFET) or a metal oxide semiconductor field effect transistor (MOSFET), within the inverter and further to provide desaturation detection and protection. The controller includes an adjustable desaturation detection circuit coupled to the power semiconductor switch to provide desaturation protection.

An inverter includes an power semiconductor switch, such as an insulated-gate bipolar transistor (IGBT)), a junction field effect transistor (JFET) or a metal oxide semiconductor field effect transistor (MOSFET), that is coupled to a drive circuit. The drive circuit is coupled to control operation of the power semiconductor switch and includes an adjustable desaturation detection circuit.

Figure 1:
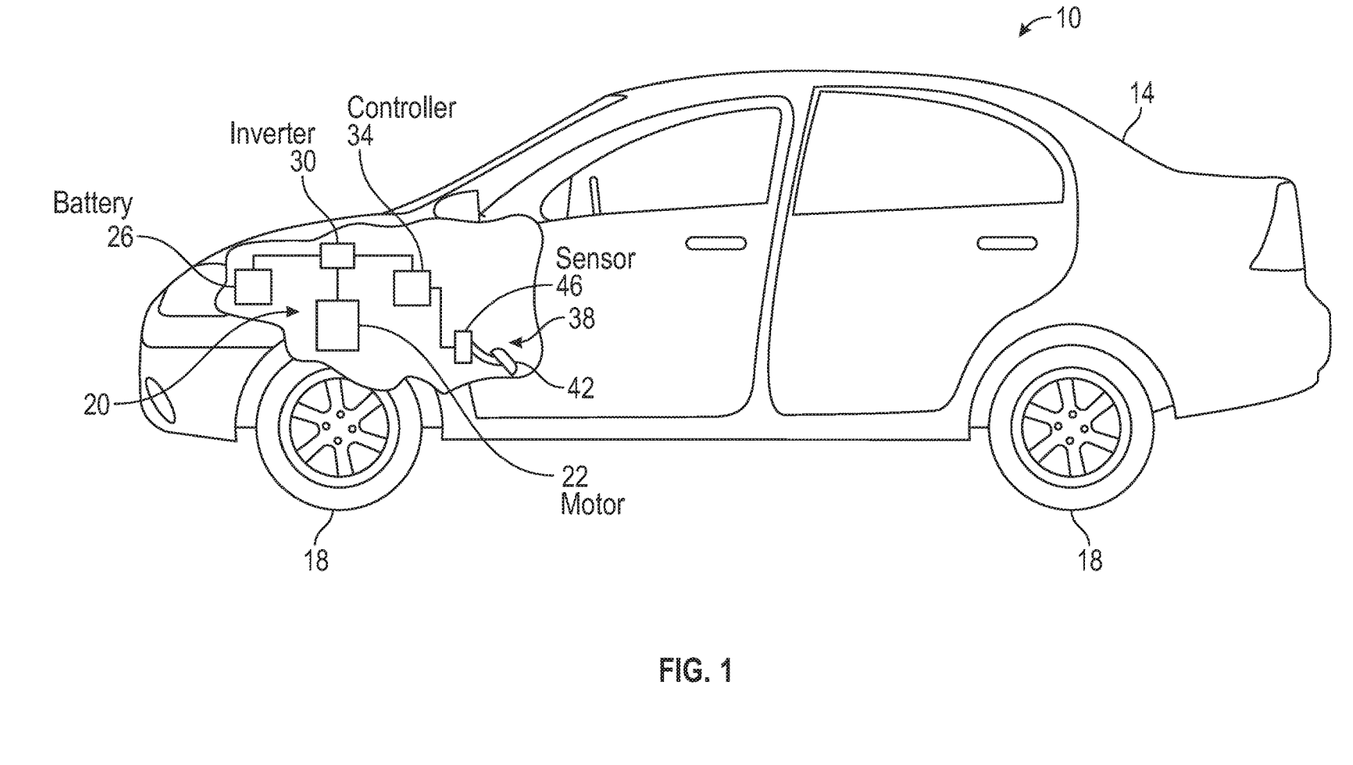
FIG. 1 is a graphic depiction of a vehicle including an electric drive system and control in accordance with the herein described exemplary embodiments.

Referring to FIG. 1, a vehicle 10 includes a vehicle body 14. The vehicle 10 also includes a plurality of wheels 18 that rotatably support the body 14 above the ground, i.e., the surface on which the vehicle is resting or traveling. The vehicle 10 also includes a powertrain 20, including an electric motor 22. The electric motor 22 is operatively connected to at least one of the wheels 18 to transmit torque thereto and thereby propel the vehicle 10. The motor 22 may be connected to the wheel 18 directly or indirectly, such as via a multi-speed transmission. The powertrain 20 also includes an electrical power source, such as a battery 26, which supplies electrical energy for the motor 22.

In the depicted embodiment, the powertrain 20 is a battery-electric powertrain, i.e., the battery 26 is the only source of energy for powering the motor 22. However, other powertrain configurations having an electric motor may be employed within the scope of the herein described embodiments. For example, the powertrain may also be a hybrid-electric powertrain in which an engine also provides power to propel the vehicle, in series or in parallel with the motor 22, or to drive a generator source to produce AC or DC electric power that may be coupled to the motor 22.

The motor 22 may be a permanent magnet motor that uses AC electric power. The battery 26 provides DC electric power. The powertrain 20 includes an inverter 30 that is operatively connected to the battery 26 such that the inverter 30 receives the DC electric power from the battery 26 and converts it to AC electric power. The inverter 30 is operatively connected to the motor 22 to transmit the AC electric power thereto.

The powertrain 20 also includes a controller 34 that is operatively connected to the inverter 30 and motor 22 such that the controller 34 controls the inverter 30 and the motor 22. The controller 34 may be a general-purpose digital computer, generally including a microprocessor or central processing unit, one or more forms of memory, clock and synchronization circuitry, analog to digital (A/D) and digital to analog (D/A) circuitry, input/output circuitry and devices (I/O) and appropriate signal conditioning and buffer circuitry. The controller 34 may have a set of control algorithms, including resident program instructions and calibrations stored in the memory and executed to provide the respective functions of the controller 34. As used herein, a "controller" may include one or more controllers, microprocessors, central processing units, or other devices that cooperate to perform the operations described herein.

The vehicle 10 also includes an input device 38 that is operable by a driver of the vehicle 10 to input a desired or requested torque output of the motor 22. In the embodiment depicted, the input device 38 includes a foot pedal 42 that is selectively depressible. The input device 38 also includes a sensor 46 that determines the position of the pedal 42 and transmits a signal indicative of the position of the pedal 42 to the controller 34. Typically, a larger displacement of the pedal from a default position is indicative of a higher requested torque. When the pedal 42 is not depressed, then the requested torque is zero. The controller 34 controls the torque output of the motor 22 by regulating the amount of energy transmitted to the motor 22 from the battery 26 via the inverter 30 in response to the position of the pedal 42.

The input device 38 may alternatively be an output of an autonomous vehicle operation controller (not depicted).

Figure 2:
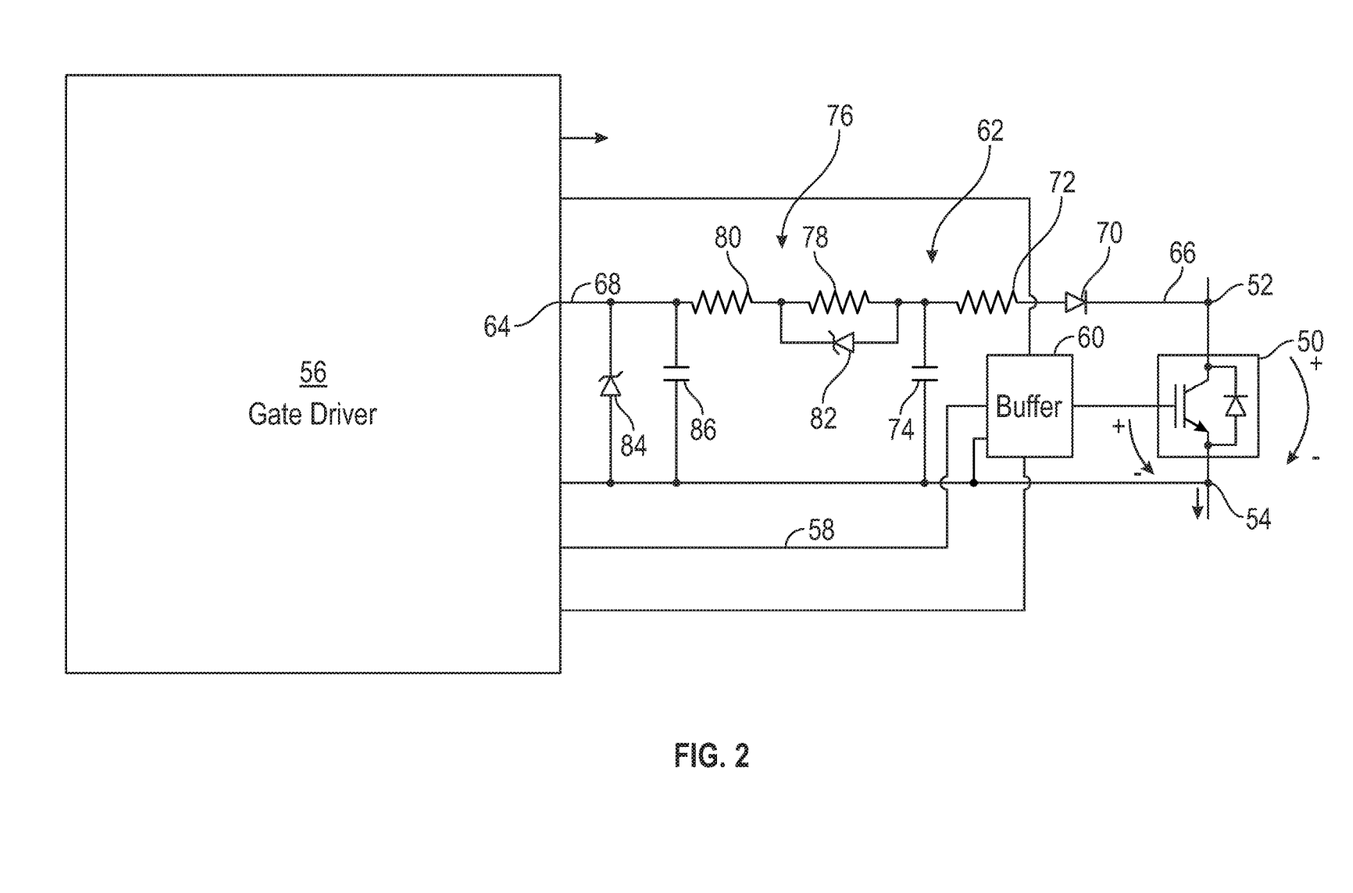
FIG. 2 is a schematic circuit diagram of an inverter in accordance with a herein described embodiment.

With reference to FIG. 2, the inverter 30 includes at least one insulated-gate bipolar transistor (IGBT) 50 coupled to control a current flow ($I_{sw}$) from its collector 52 to its emitter 54 for providing AC electric power to the motor 22. The operation of the IGBT 50 to provide AC electric power to the motor 22 is controlled by a gate driver 56, a gate drive output ($V_{ce}$) 58 of which is operably coupled to the IGBT 50 via gate drive buffer circuit 60. The gate drive circuit 56 operates in response to one or more control signals from the controller 34, or other suitable controller device.

A desaturation detection circuit 62 is coupled from the collector 52 to a desaturation input 64 of the gate driver 56. The gate driver 56 further includes $V_{cc}$ and $V_{ee}$ pin outs as are well known operably coupled to the IGBT 50, buffer circuit 60 and desaturation detection circuit 62.

As depicted in FIG. 2 and in accordance with the herein described embodiments, the IGBT 50, the gate driver 56 and the gate drive buffer circuit 60 may be commercially available devices specified for the particular application. The gate driver 56 is operable upon detection that the IGBT 50 has become desaturated, to turn the IGBT 50 off to stop the current flow therethrough. The desaturation detection circuit 62 is operably coupled to the collector 52 and couples the collector voltage ($V_{ce}$) 66 to the desaturation input 64 as desaturation voltage 68. IGBT desaturation is detected by the gate driver 56 by comparing the desaturation voltage 68 with a fixed internal voltage reference. When the desaturation voltage 68 exceeds the fixed internal threshold, the gate driver 56 is operable to turn the IGBT 50 off, or to take other action to limit damage to the IGBT 50 as a result of becoming desaturated.

The desaturation detection circuit 62 includes a desaturation voltage sensing diode ($D_{dst}$) 70, desaturation resistor ($R_{dst1}$) 72 and desaturation capacitors ($C_{dst1}$) 74 and ($C_{dst2}$) 86. Desaturation detection circuit 62 further includes level shift circuit 76 including a first level shift resistor ($R_{lsh1}$) 78 and a second level shift resistor ($R_{lsh2}$) 80. $D_{dst}$ 70, $R_{dst1}$ 72 and $C_{sat1, dst2}$ 74 operate in a known manner to provide the desaturation voltage 68 with a configured blanking time, detection delay and reset discharge. Within desaturation detection circuit 62, selection of the values for $R_{lsh1}$ 78 and $R_{lsh2}$ 80 provides reference level shifting effect of the internal threshold. That is, the internal reference level is shifted relative to the fixed internal desaturation reference voltage of the gate driver 56 so that desaturation of the IGBT 50 is caused to be detected for a given desaturation voltage 68 in view of the shifted reference level.

With continued reference to FIG. 2, within the level shift circuit 76, there is provided in parallel with $R_{lsh1}$ 78, a diode ($D_{lsh1}$) 82. Further provided is a diode ($D_{prt}$) 84 to provide voltage protection at desaturation input 64. Diode $D_{lsh1}$ 82 provides for fast discharge of capacitors $C_{dst1}$, and $C_{dst2}$ 86 by bypassing $R_{lsh1}$ 76 during discharge allowing for the designer to maintain a suitable protection blanking time. This arrangement further allows for the value of $R_{lsh2}$ 80 to be substantially less than the value of $R_{lsh1}$ 76, for example one or more orders of magnitude less than the value of $R_{lsh1}$ 102 because diode Dish' 82 provides for fast discharge of capacitors $C_{dst1}$ 74 and $C_{dst2}$ 86 maintaining proper protection blanking time. In accordance with the embodiment of the circuit 76, the internal reference voltage of the gate driver 56 is effectively shifted to a new voltage threshold, $V_{thr}$, in accordance with the equation below, where $V_{ref}$ is the internal reference voltage of the gate driver 56 and $I_{Cs}$ is the internal sense current of the gate driver 56. The discharge time, $\tau_{dch}$, is provided as shown below where $R_{int}$ is the internal discharge resistance of the gate driver 56 and $R_{MOS}$ is the resistance of the internal discharge MOSFET switch of the gate driver 56, and the protection blanking time, $t_{blanking}$, is provided as given below.

$$V_{thr} = V_{ref} - I_{cs}(R_{lsh1} + R_{lsh2})$$

$$\tau_{dch} = C_{dst}(R_{lsh2} + R_{int} + R_{MOS})$$

$$t_{blanking} = \frac{C_{dst}(V_{ref} - I_{cs}(R_{lsh1} + R_{lsh2}))}{I_{cs}}$$

Figure 3:
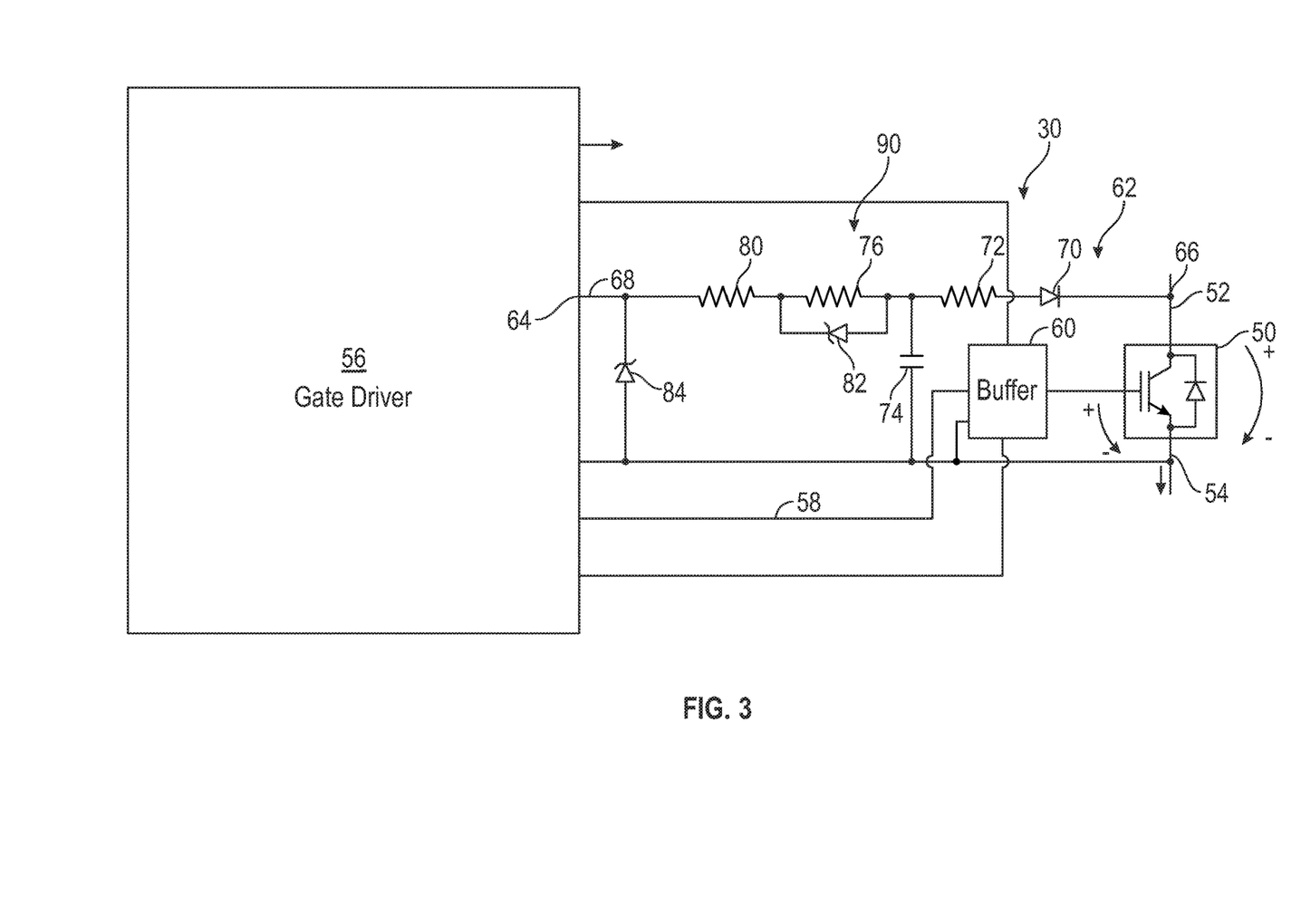
FIG. 3 is a schematic circuit diagram of an inverter in accordance with a herein described embodiment.

With reference to FIG. 3, an alternative embodiment of the level shift circuit 76, level shift circuit 90, is shown. Within level shift circuit 90, which is structurally and functionally similar to level shift circuits according to the herein described exemplary embodiments, there is provided only one desaturation capacitor $C_{dst1}$ 74. The selection of one or more capacitors $C_{dst1}$ 74, is optional; however, as the capacitance of $C_{dst1}$ 74 and $C_{dst2}$ 86 are additive, it allows for the use of smaller capacitive components generally, and furthermore improves noise suppression at desaturation input 64.

Figure 4:
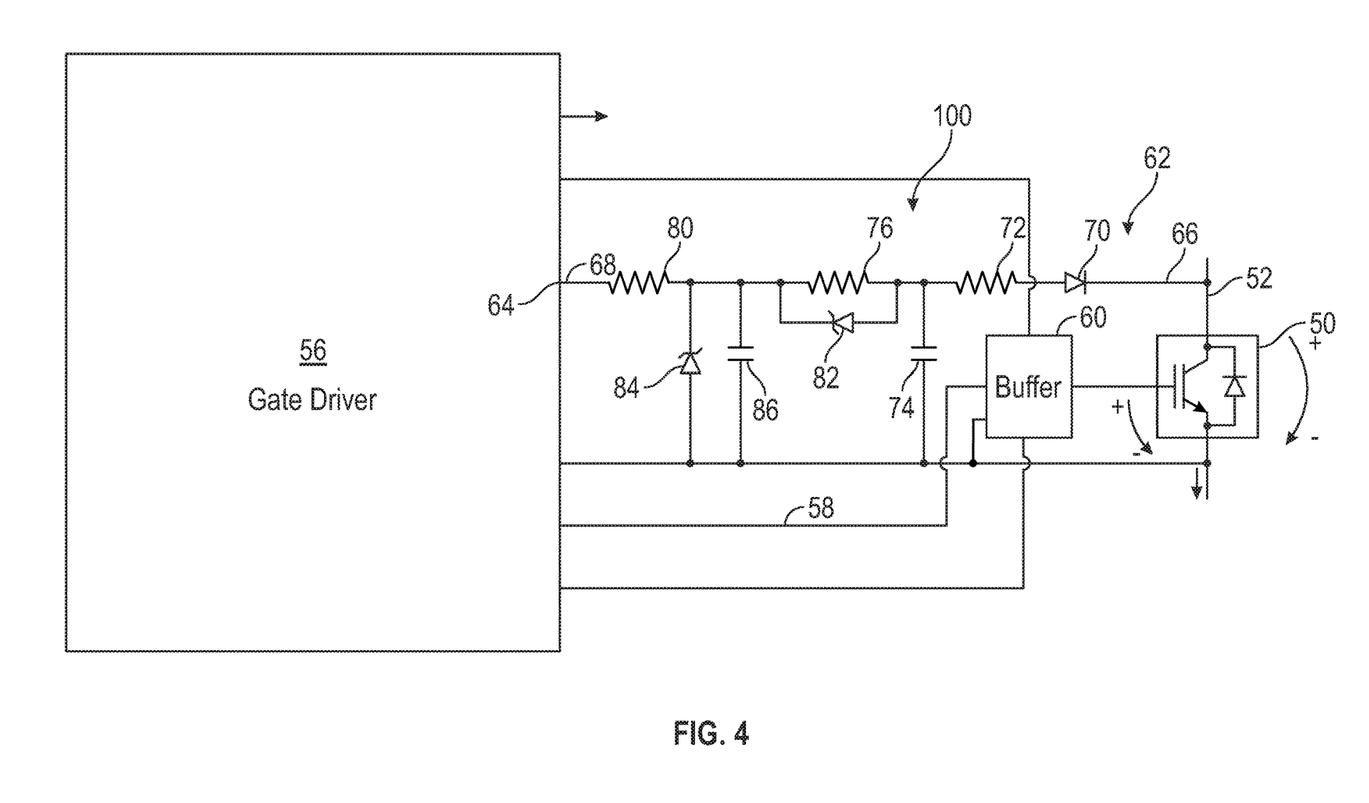
FIG. 4 is a schematic circuit diagram of an inverter in accordance with a herein described embodiment.

With reference now to FIG. 4, still a further alternative embodiment of the level shift circuit 76, level shift circuit 100, is shown. Within the level shift circuit 100, which is structurally and functionally similar to level shift circuits according to the herein described exemplary embodiments, the second level shift resistor ($R_{lsh2}$) 80 is disposed at and directly connected to the desaturation input 64.

Figure 5:
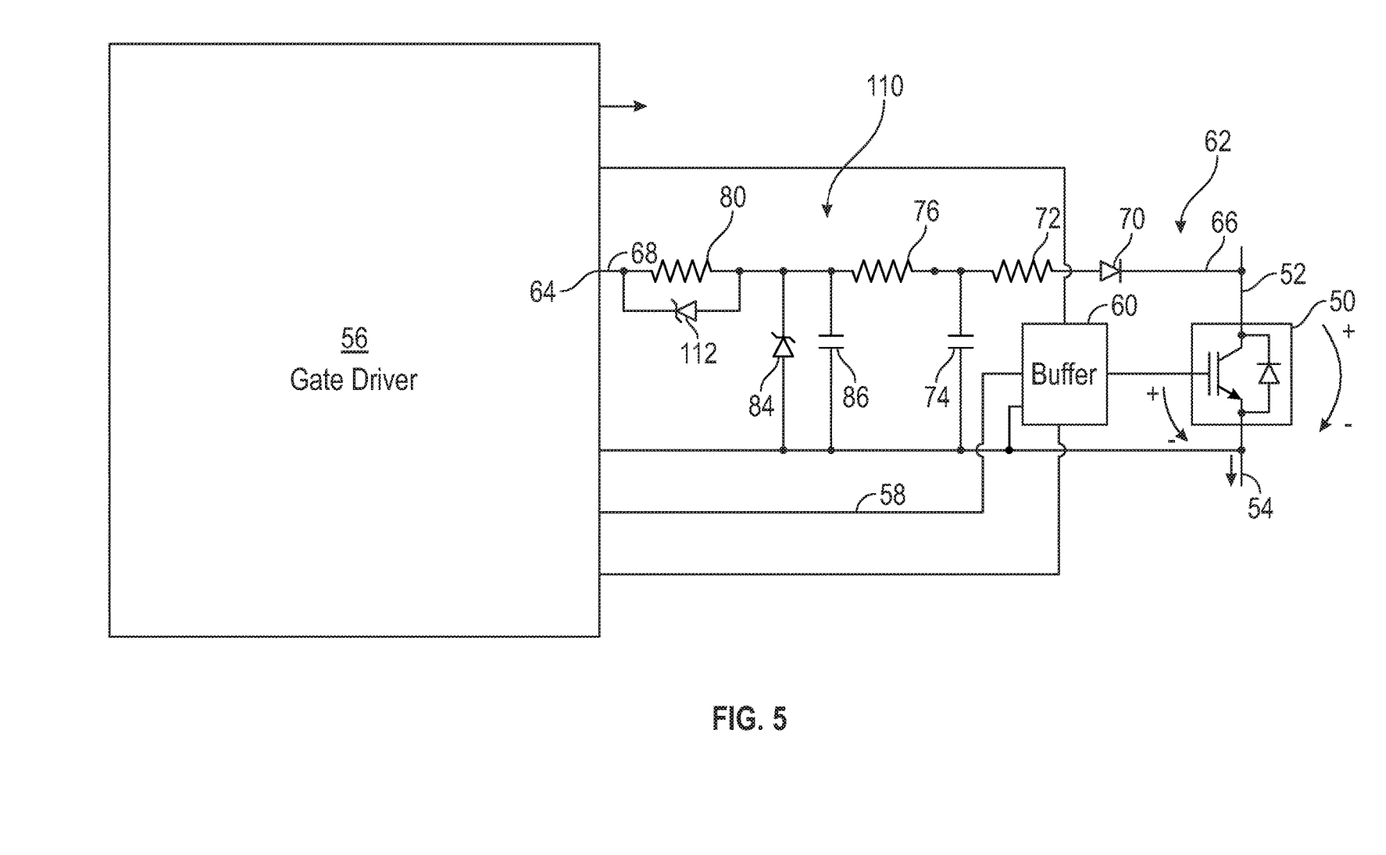
FIG. 5 is a schematic circuit diagram of an inverter in accordance with a herein described embodiment.

With reference to FIG. 5, still another alternative embodiment of the level shift circuit 76, level shift circuit 110 is shown. Within the level shift circuit 110, which is structurally and functionally similar to level shift circuits according to the herein described exemplary embodiments, diode, $D_{lsh1}$ 112 is now placed in parallel with resistor, $R_{lsh2}$ 80, and still provides for fast discharge in order to maintain a desired desaturation protection blanking time. Because $R_{lsh2}$ 80 is now bypassed for discharge purposes, the values of $R_{lsh1}$ 76 and $R_{lsh2}$ 80 may be altered such that the value of $R_{lsh2}$ 80 will generally be greater than the value of $R_{lsh1}$ 76.

Figure 6:
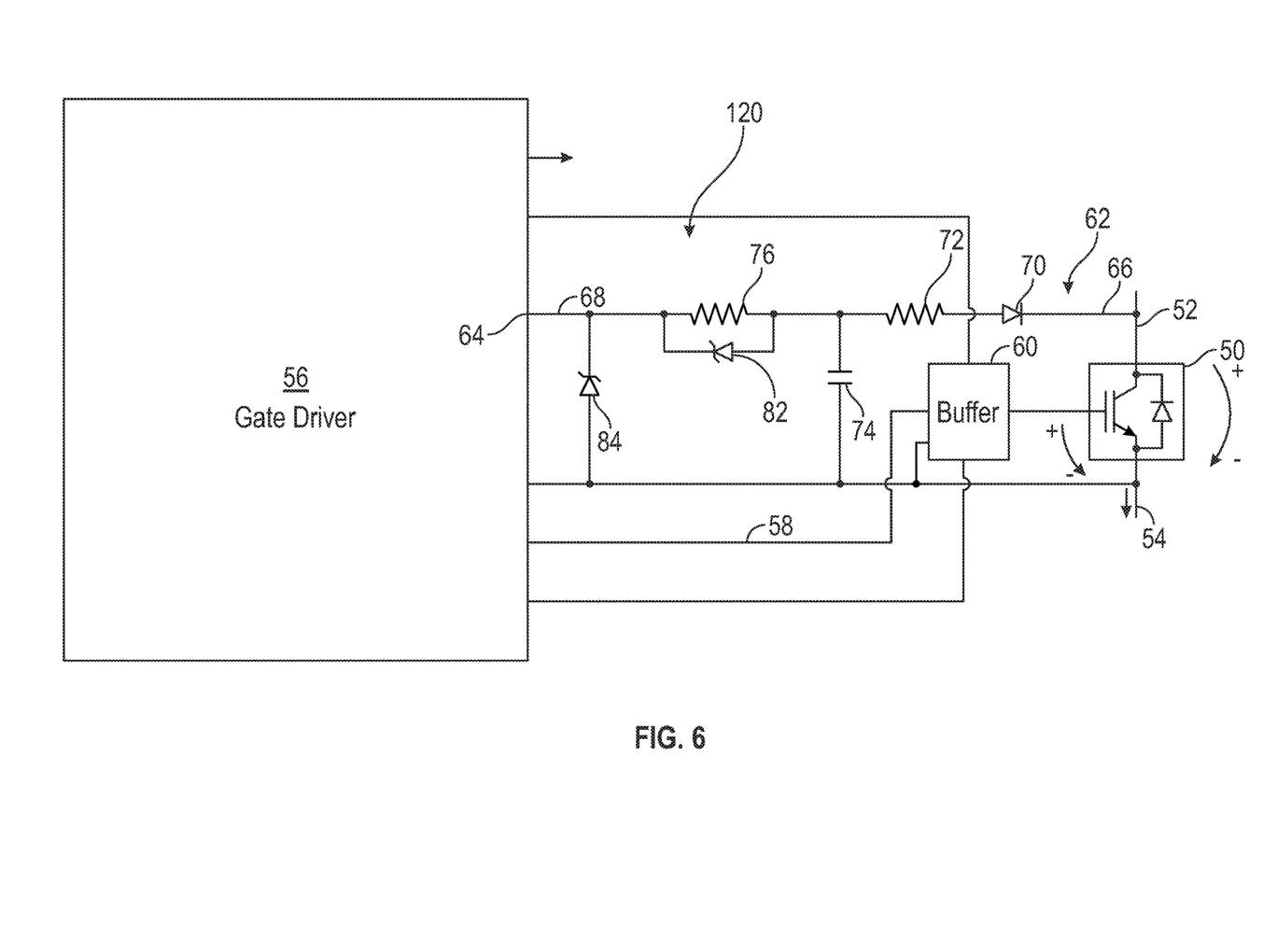
FIG. 6 is a schematic circuit diagram of an inverter in accordance with a herein described embodiment.

With reference to FIG. 6, still another alternatively embodiment of the level shift circuit 76, level shift circuit 120 is shown. Within the level shift circuit 120, which is structurally and functionally similar to level shift circuits according to the herein described exemplary embodiments, only capacitor $C_{dst1}$ 74, resistor, $R_{lsh1}$ 76, bypass diode $D_{lsh1}$ 82 are provided. This embodiment of the level shift circuit 120 reduces the number of required components.

Figure 7:
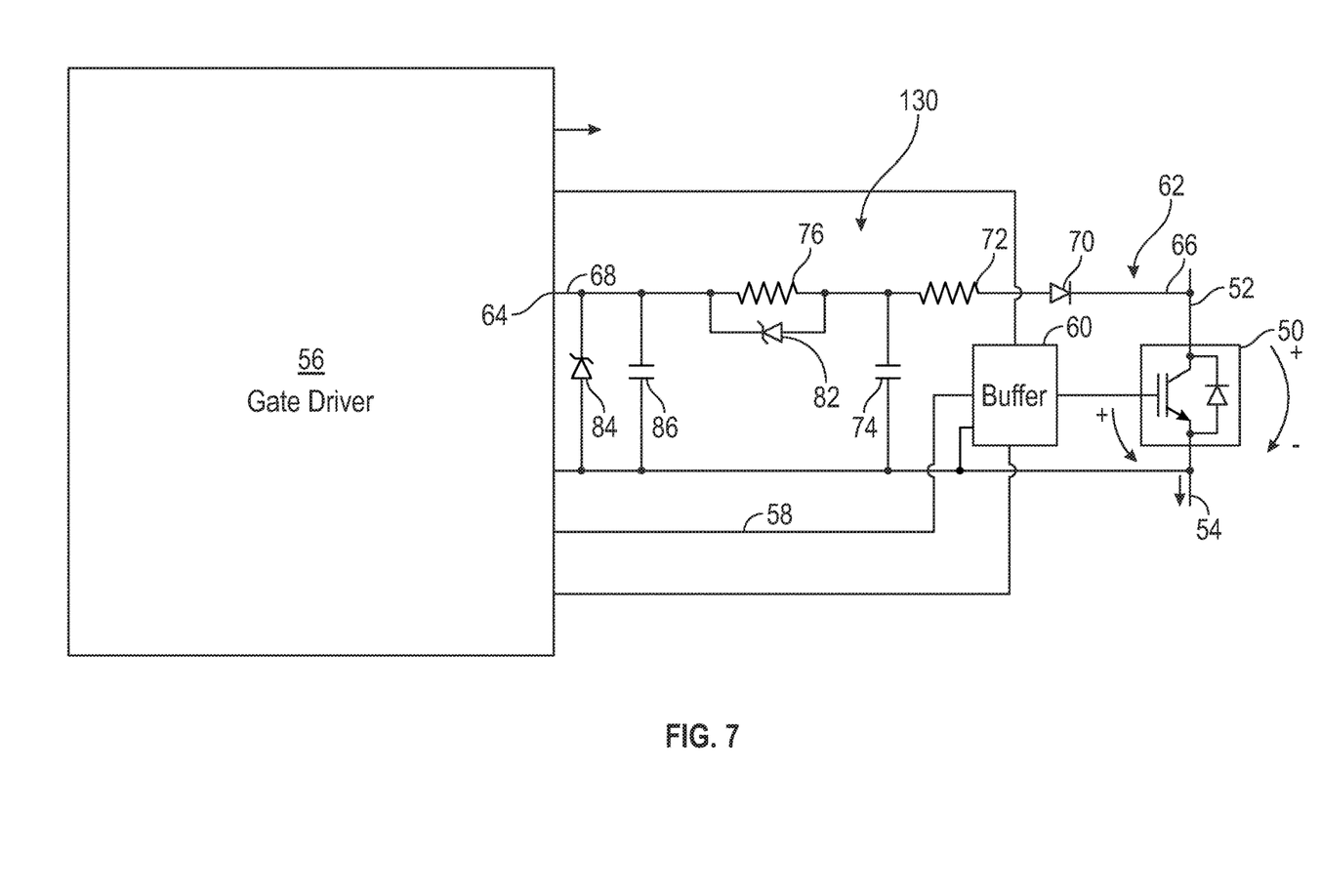
FIG. 7 is a schematic circuit diagram of an inverter in accordance with a herein described embodiment.

With reference to FIG. 7, still another alternatively embodiment of the level shift circuit 76, level shift circuit 130 is shown. Within the level shift circuit 130, which is structurally and functionally similar to level shift circuits according to the herein described exemplary embodiments, capacitors $C_{dst1}$ 74 and $C_{dst2}$ 86 are provided along with resistor, $R_{lsh1}$ 76 and bypass diode $D_{lsh1}$ 82.

As will be appreciated from the embodiments of desaturation detection circuits depicted in FIGS. 2-7, various configurations are possible wherein structurally and functionally a level shifting circuit structure is provided between the IGBT collector 52 and the desaturation input 64 of the gate driver 56. The level shifting circuit structure effectively level shifts the fixed internal desaturation detection threshold of the gate driver 56. It will be further appreciated that the circuit structures may be modified in any number of ways or combinations, even those not specifically disclosed, while still achieving the gate driver desaturation reference voltage level shifting effect and allow the designer to fully advantage the capabilities of various IBGT devices while advantageously using commercially available IGBT gate driver circuit devices.

Figure 8:
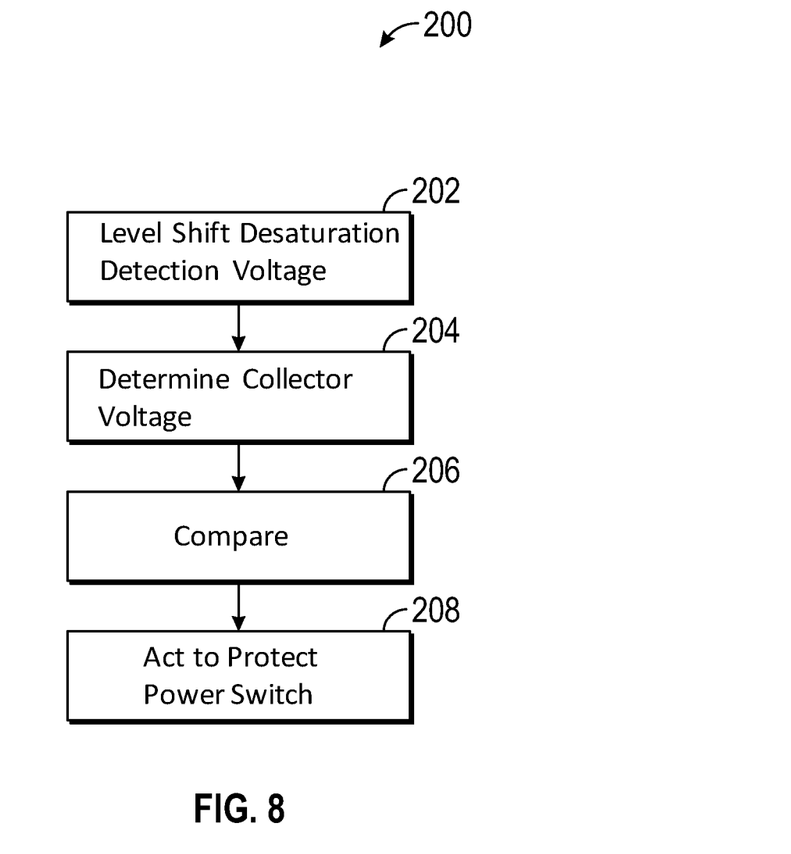
FIG. 8 is flow chart illustration of a method of detecting desaturation of an insulated-gate bipolar transistor in accordance with a herein described embodiment.

With reference to FIG. 8, a method 200 of providing IGBT desaturation protection is shown in flow chart form. At 202, a desaturation reference voltage level of a gate driver is level shifted. At 204, a collector voltage of an IGBT of an inverter coupled to the gate driver is determined. The collector voltage is compared to the level shifted desaturation reference voltage, at 206, and at 208, action is taken to protect the IGBT from desaturation in view of the comparison.

The foregoing detailed description is merely exemplary in nature and is not intended to limit the application and uses. Furthermore, there is no intention to be bound by any expressed or implied theory presented in the preceding technical field, background, brief summary or the detailed description. It should be understood that throughout the drawings, corresponding reference numerals indicate like or corresponding parts and features. As used herein, the term system or module may refer to any combination or collection of mechanical systems and components and/or other suitable components that provide the described functionality.

Embodiments may be described herein in terms of functional and/or logical block components and various processing steps. It should be appreciated that such block components may be realized by any number, combination or collection of mechanical components configured to perform the specified functions. Those skilled in the art will appreciate that the herein described embodiments may be practiced in conjunction with any number of mechanical components and systems, and that the systems described herein are merely exemplary.

For the sake of brevity, conventional components and techniques and other functional aspects of the components and systems (and the individual operating components of the systems) may not be described in detail herein. Furthermore, the connecting lines shown in the various figures contained herein are intended to represent example functional relationships and/or physical couplings between the various elements. It should be noted that many alternative or additional functional relationships or physical connections may be present in an embodiment of the invention.

While at least one exemplary embodiment has been presented in the foregoing detailed description, it should be appreciated that a vast number of variations exist. While the exemplary embodiments have been described in terms of providing desaturation protection for IGBT based inverters typically used in electric vehicle applications, the herein described systems and methods may find application to a broad range of power semiconductor switches including silicon (Si), silicon carbide (SiC), gallium nitride (GaN) and other wide band gap material devices. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing the exemplary embodiment or exemplary embodiments. It should be understood that various changes can be made in the function and arrangement of elements without departing from the scope of the disclosure as set forth in the appended claims and the legal equivalents thereof. Accordingly, details of the exemplary embodiments or other limitations described above should not be read into the claims absent a clear intention to the contrary.

The invention claimed is:

1. An electric vehicle comprising:
   a direct current (DC) power source with a DC electric power output;
   an inverter coupled to receive the DC electric power output of the DC power source, the inverter having an alternating current (AC) electric power output;
   an electric motor coupled to receive the AC electric power output, the electric motor having a driving torque output that is coupled to drive at least one wheel of the vehicle, wherein
   the inverter includes a power semiconductor switch, the power semiconductor switch having an insulated-gate bipolar transistor (IGBT), a gate of the IGBT being operably driven by a gate driver circuit having a driving output coupled to the gate, and a protection circuit including a desaturation detection circuit coupled between a collector of the IGBT and a desaturation input of the gate driver circuit, and wherein the desaturation detection circuit has a reference shift circuit, the reference shift circuit being disposed between the IGBT collector and the desaturation detection input of the gate driver circuit and being operable to shift a detected voltage at the collector of the IGBT to a shifted voltage, the shifted voltage having a voltage different than the detected voltage, the shifted voltage being coupled to the desaturation detection input; and wherein
   the reference shift circuit comprises a first level shift resistor and a second level shift resistor, the first level shift resistor and the second level shift resistor being coupled in series, the first level shift resistor and the second level shift resistor being coupled between a collector of the IGBT and the desaturation input and a diode coupled in parallel with one of the first level shift resistor and the second level shift resistor.

2. The electric vehicle of claim 1, wherein the first level shift resistor has a resistance value substantially greater than a resistance value of the second level shift resistor.

3. The electric vehicle of claim 1, wherein a blanking time of the desaturation detection circuit is based on at least one of the first level shift resistor and the second level shift resistor.

4. The electric vehicle of claim 1, the desaturation detection circuit comprising a first desaturation capacitor and a second desaturation capacitor, the first desaturation capacitor and the second desaturation capacitor being coupled in parallel.

5. A desaturation protection circuit for a power semiconductor switch based inverter comprising:
   an insulated-gate bipolar semiconductor,
   a gate of the IGBT is operably driven by a gate driver circuit having a driving output coupled to the gate, and a desaturation detection circuit is coupled between a collector of the IGBT and a desaturation input of the gate driver circuit, and wherein the desaturation detection circuit has a reference shift circuit, the reference shift circuit being disposed between the IGBT collector and the desaturation detection input of the gate driver circuit and being operable to shift a detected voltage at the collector of the IGBT to a shifted voltage, the shifted voltage having a voltage different than the detected voltage, the shifted voltage being coupled to the desaturation detection input; and wherein
   the reference shift circuit comprises a first level shift resistor and a second level shift resistor, the first level shift resistor and the second level shift resistor being coupled in series, the first level shift resistor and the second level shift resistor being coupled between a collector of the IGBT and the desaturation input and a diode coupled in parallel with one of the first level shift resistor and the second level shift resistor.

6. The desaturation protection circuit of claim 5, wherein the first level shift resistor has a resistance value substantially greater than a resistance value of the second level shift resistor.

7. The desaturation protection circuit of claim 5, wherein a blanking time of the desaturation detection circuit is based on at least one of the first level shift resistor and the second level shift resistor.

8. The desaturation protection circuit of claim 5, the desaturation detection circuit comprising a first desaturation capacitor and a second desaturation capacitor, the first desaturation capacitor and the second desaturation capacitor being coupled in parallel.

* * * * *